United States Patent
Gerving et al.

(10) Patent No.: US 11,140,795 B2
(45) Date of Patent: Oct. 5, 2021

(54) ADAPTER FOR INSTALLING ELECTROTECHNICAL COMPONENTS

(71) Applicant: Eaton Intelligent Power Limited, Dublin (IE)

(72) Inventors: Karsten Gerving, Bonn (DE); Ute Molitor, Bad Neuenahr-Ahrweiler (DE)

(73) Assignee: EATON INTELLIGENT POWER LIMITED, Dublin (IE)

( * ) Notice: Subject to any disclaimer, the term of this patent is extended or adjusted under 35 U.S.C. 154(b) by 0 days.

(21) Appl. No.: 16/770,088

(22) PCT Filed: Nov. 29, 2018

(86) PCT No.: PCT/EP2018/082988
§ 371 (c)(1),
(2) Date: Jun. 5, 2020

(87) PCT Pub. No.: WO2019/110414
PCT Pub. Date: Jun. 13, 2019

(65) Prior Publication Data
US 2021/0014993 A1    Jan. 14, 2021

(30) Foreign Application Priority Data
Dec. 8, 2017   (DE) ..................... 10 2017 129 217.9

(51) Int. Cl.
*H05K 7/02*   (2006.01)
*H02B 1/052*   (2006.01)

(52) U.S. Cl.
CPC ............ *H05K 7/023* (2013.01); *H02B 1/052* (2013.01)

(58) Field of Classification Search
USPC ........................................................ 361/809
See application file for complete search history.

(56) References Cited

U.S. PATENT DOCUMENTS

| 5,316,164 | A | * | 5/1994 | Feuerlein | ............... | H02B 1/052 |
| | | | | | | 220/3.2 |
| 5,863,219 | A | * | 1/1999 | Rischard | .................. | H02B 1/21 |
| | | | | | | 439/532 |
| 6,452,785 | B1 | | 9/2002 | Bury et al. | | |
| 6,531,940 | B1 | | 3/2003 | Busch | | |

(Continued)

FOREIGN PATENT DOCUMENTS

| DE | 29508611 U1 | 8/1995 |
| DE | 19627295 A1 | 6/1997 |

(Continued)

*Primary Examiner* — Hung S. Bui
(74) *Attorney, Agent, or Firm* — Leydig, Voit & Mayer, Ltd.

(57) ABSTRACT

An adapter for installing electrotechnical components includes: a standardized support rail having a top-hat rail, and which has fastening means on an upper face thereof for installing an electrotechnical component, and fastening means on a bottom face thereof for installing on a front panel of an electrotechnical component. The fastening means on the bottom face have at least one latch hook for latching into a corresponding latch opening on the front panel of the electrotechnical component, and/or the fastening means on the bottom face have at least one snap hook for snapping into a corresponding snap opening on the front panel of the electrotechnical component.

9 Claims, 3 Drawing Sheets

(56) References Cited

U.S. PATENT DOCUMENTS

| | | | | |
|---|---|---|---|---|
| 2005/0175402 A1* | 8/2005 | Schurr | ................. | H05K 7/1474 403/331 |
| 2014/0357095 A1* | 12/2014 | Kute | ................... | H01R 13/514 439/34 |
| 2015/0188298 A1* | 7/2015 | Lutze | ....................... | H02B 1/32 211/26 |

FOREIGN PATENT DOCUMENTS

| | | |
|---|---|---|
| DE | 19748531 A1 | 5/1999 |
| DE | 202008015309 U1 | 8/2009 |
| DE | 102012016094 A1 | 2/2014 |
| DE | 202016103379 U1 | 9/2017 |
| FR | 2447132 A1 | 8/1980 |
| WO | 9945556 A1 | 9/1999 |
| WO | 2015144265 A1 | 10/2015 |

\* cited by examiner

ADAPTER FOR INSTALLING ELECTROTECHNICAL COMPONENTS

CROSS-REFERENCE TO PRIOR APPLICATIONS

This application is a U.S. National Phase application under 35 U.S.C. § 371 of International Application No. PCT/EP2018/082988, filed on Nov. 29, 2018, and claims benefit to German Patent Application No. DE 10 2017 129 217.9, filed on Dec. 8, 2017. The International Application was published in German on Jun. 13, 2019 as WO 2019/110414 under PCT Article 21(2).

FIELD

The present disclosure relates to an adapter for installing electrotechnical components.

BACKGROUND

Support rails are metal profile rails to which electrotechnical components such as electrical protect switches, relays and terminals in distribution boxes, switch cabinets, port boxes and the like are fastened. A component can be laterally pushed onto a support rail, or it can be plugged and clamped at the front. Support rails can have a standardized form according to DIN EN 60715 (shortly DIN rail). An example of such a DIN rail is the so-called top-hat rail according to DIN EN 60715 TH35, which has a U-shaped, especially hat-shaped profile. This top-hat rail is also referred to as a DIN rail. Components must be specially prepared for the installation on a top-hat rail. Typically, this is the case with components that are provided for an installation in a switch cabinet.

From the German utility model application DE 295 08 611 U1, a universal motor protection relay having a formed housing is known, in which a support rail is integrated at the front by forming, in such a manner that it can be connected in a simple manner with an electromagnetic switching apparatus such as a contactor. The German patent application DE 196 27 295 A1 discloses an amplifier module in which a support rail is also formed at the front of the housing to allow, for example, a contactor to be fastened to it.

From the international patent application WO 2015/144265 A1, a bus-capable port and/or function module, which can be connected in series, for controlling and/or monitoring technical processes with a block-like structure is known, which has a base unit for fastening to a support rail.

The German utility model application DE 20 2008 015309 U1 discloses an installation system for installing electrical and/or mechanical components on an installation base, which has at least one installation base profile or at least one installation base body.

The German patent application DE 197 48 531 A1 describes a consumer branch for switching and protecting a consumer which can be connected in a main circuit for voltages above 100 volts, comprising a branch assembly and a support part having first plug ports for connecting to a power bus having main current lines, to a data bus and, if necessary, to an auxiliary power bus, wherein the branch assembly can be mechanically adapted on the support part and can be contacted with the first plug ports via a first counter-plug port.

SUMMARY

In an embodiment, the present invention provides an adapter for installing electrotechnical components, comprising: a standardized support rail comprising a top-hat rail, and which has fastening means on an upper face thereof configured to install an electrotechnical component, and fastening means on a bottom face thereof configured to install on a front panel of an electrotechnical component, wherein the fastening means on the bottom face has at least one latch hook configured to latch into a corresponding latch opening on the front panel of the electrotechnical component, and/or the fastening means on the bottom face has at least one snap hook configured to snap into a corresponding snap opening on the front panel of the electrotechnical component.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
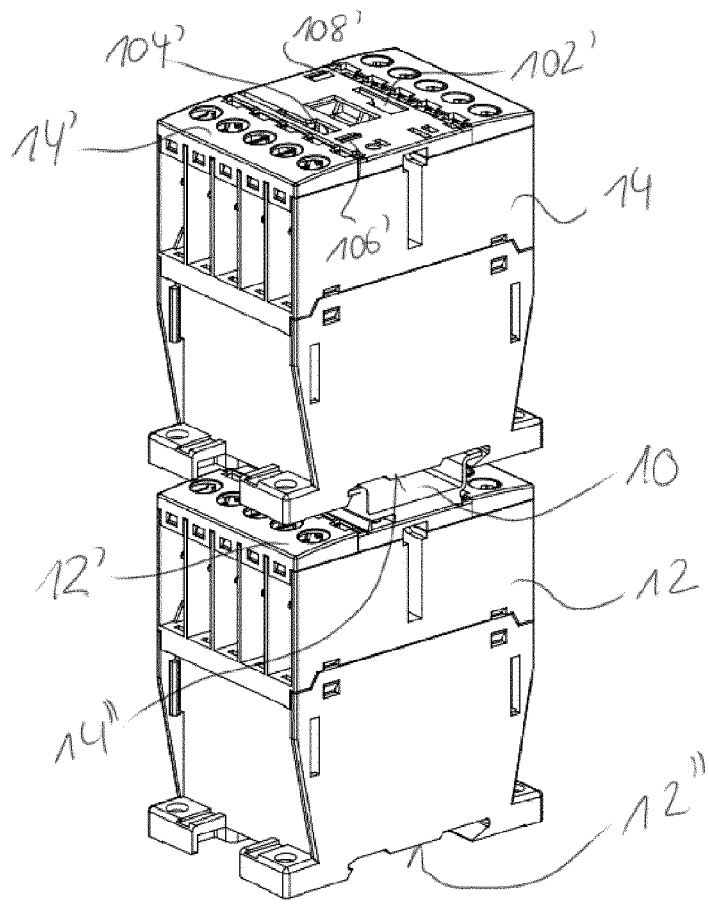
FIG. 1 is an embodiment of a stacked arrangement of two switching apparatuses and connected by an embodiment of a top-hat rail adapter.

In the following, an adapter for installing electrotechnical components is described.

According to a first aspect, an adapter for installing electrotechnical components is disclosed, which is designed in the form of a standardized support rail, especially a top-hat rail. On its upper face the adapter has fasteners for installing an electrotechnical component, and on its bottom face it has fasteners for installing an electrotechnical component on the front panel. This type of adapter enables a stacked arrangement of electrotechnical components like, for example, switching apparatuses, contactors, motor protection switches or similar components in, for example, a switch cabinet. Thereby, the space present in a switch cabinet can be used efficiently compared to an arrangement of the components on a support rail next to each other.

The fastening means on the bottom face of the adapter may have at least a latch hook which is designed for latching into a corresponding latch opening on the front panel of the electrotechnical component. The fastening means on the bottom face of the adapter may alternatively or additionally have at least a snap hook which is designed for snapping into a corresponding snap opening on the front panel of the electrotechnical component. A component can be fixed to the adapter by latching and/or snapping it.

In implementations of the adapter, at least one protrusion may be provided on the upper face of the adapter. The at least one protrusion may in particular be provided to prevent an unintentional displacement of a component installed on the adapter in the installation plane.

In further implementations of the adapter, the fastening means on the bottom face of the adapter may have at least one screw that can be screwed into a corresponding threaded opening on the front panel of an electrotechnical component.

In further implementations of the adapter, the fastening means on the upper face of the adapter may have at least one thread into which a screw provided on the bottom face of an electrotechnical component can be screwed.

In implementations of the adapter, at least one of the fastening means on the bottom face of the adapter may be designed in such a manner that it can cooperate with a fastening means intended for installing an additional component, for example an auxiliary switch, on the front panel of an electrotechnical component, in particular a latch opening. Thereby, the adapter can be installed on conventional electrotechnical components such as switching apparatuses, which are intended for the installation in a switch cabinet and whose front panel is designed for the installation of additional components such as auxiliary switches, for example instead of an additional component.

The adapter may in particular be manufactured from plastic. In particular, the adapter can be designed as a plastic injection-molded part or as a punched or punched-bent part from a formable material, for example a sheet, whereby it can be manufactured with a relatively low technical effort.

In implementations of the adapter, its dimensions in the installation plane may be adapted to the front panel of at least one electrotechnical component in such a manner that no parts of the adapter project beyond the front panel. This enables, for example, the installation of a plurality of components directly next to each other on a support rail of a switch cabinet and of an adapter on the front panels of one or a plurality of these components, in such a manner that further components can be installed on the corresponding components. Components installed next to each other on the support rail may be removed without obstruction by installed adapters, and components may also be installed on the support rail.

According to a second aspect, an electrotechnical component is disclosed, which is designed for the installation on a standardized support rail and has on its front panel at least one latch opening, at least one snap opening and/or at least one threaded opening for latching or snapping or screwing in at least one latch hook or snap hook or at least one screw of an adapter, according to the first aspect and as described herein.

A third aspect refers to a stacked arrangement of two electrotechnical components in which an adapter is installed on the front panel of a first component of the arrangement, in accordance with the first aspect and as described herein, and a second component having fastening means on its bottom face is installed on the fastening means on the upper face of the adapter.

In the following description, identical, functionally identical and functionally related elements can be provided with the same reference signs. Absolute values are only given as examples in the following and are not to be understood as limiting.

FIG. 1 shows a stack arrangement of a first and a second switching apparatus 12 or 14. The bottom faces 12", 14" of the switching apparatuses 12 or 14 are each designed for installing the switching apparatus 12 or 14 on a top-hat rail. The front plates 12' or 14' opposite the bottom faces 12', 14' are designed for installing a top-hat rail adapter 10 and have corresponding openings for this purpose, which can be recognized in FIG. 1 in the front plate 14'. The openings are two latch openings 102', 104' arranged next to each other and two snap openings 106', 108' arranged approximately diametrically opposite to each other. The openings may, for example, be provided to install an additional component such as an auxiliary switch on the front panel, i.e. they do not have to be specially provided for the installation of the top-hat rail adapter in the front panel, although this is of course also possible. Corresponding latch hooks or snap hooks may latch or snap into these openings, which fix the top-hat rail adapter 10 on the front panel 12' of the switching apparatus 12 in such a manner that the adapter 10 cannot fall off the front panel 12' or slip on the front panel 12'. Alternatively or additionally, the top-hat rail adapter 10 can be fastened to the front panel 12' by a screw connection. For this purpose, for example, one or a plurality of screws can be passed through corresponding openings in the adapter and screwed into the threaded holes in the front panel of the switching apparatus.

The stacked arrangement of the two switching apparatuses 12 and 14 may, for example, be installed in a space-saving manner in a switch cabinet on a top-hat rail provided therein by attaching the lower switching apparatus 12 with its bottom face 12" to the top-hat rail of the switch cabinet and, for example, clamping it thereto. The stack arrangement can be installed in various ways: first the lower switching apparatus 12 can be installed on the top-hat rail of the switch cabinet, then the top-hat rail adapter 10 on the installed switching apparatus 12 and finally the upper switching apparatus 14 on the adapter 10. The advantage of this type of installation is that, for example, after installing the lower switching apparatus 12, it may be wired before proceeding with the installation of the adapter 10 and second switching apparatus 14. Alternatively, the pre-installed stack arrangement, consisting of the switching apparatuses 12 and 14 and the adapter 10, can be installed directly on the top-hat rail of the switch cabinet. This can shorten the installation process.

Figure 2:
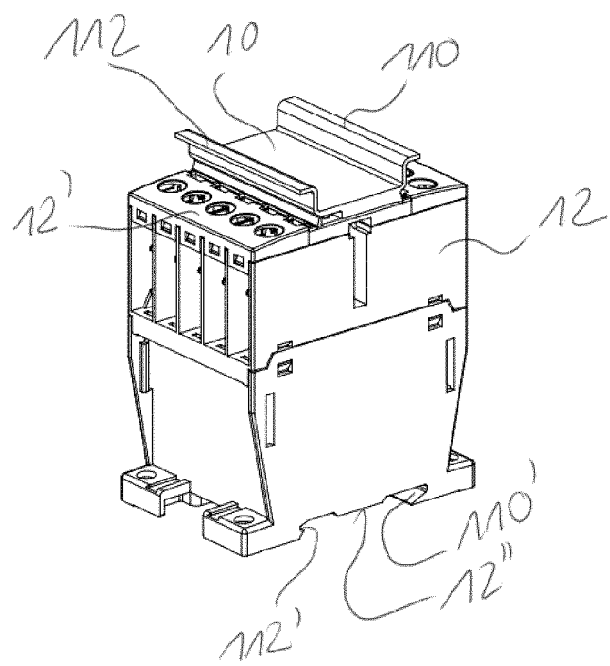
FIG. 2 is the lower switching apparatus of the arrangement of FIG. 1 having the top-hat rail adapter installed on its front plate.

FIG. 2 shows the lower switching apparatus 12 of the stack arrangement of FIG. 1 having the top-hat rail adapter 10 installed on the front plate 12'. The two terminal legs 110, 112 on the visible upper face of the adapter 10 are clamped for installing in corresponding receptacles on the bottom face 14" of the upper switching apparatus 14, as for top-hat rail installation, in such a manner that a secure fastening of the two switching apparatuses 12 and 14 to one another is ensured. In FIG. 2 the two corresponding receptacles on the bottom face 12" of the switching apparatus 12 are referred to with the reference signs 110', 112'. The terminal legs of a top-hat rail of a switch cabinet or of another adapter can be clamped into these receptacles, for example, in a stack arrangement of three switching apparatuses.

Figure 3:
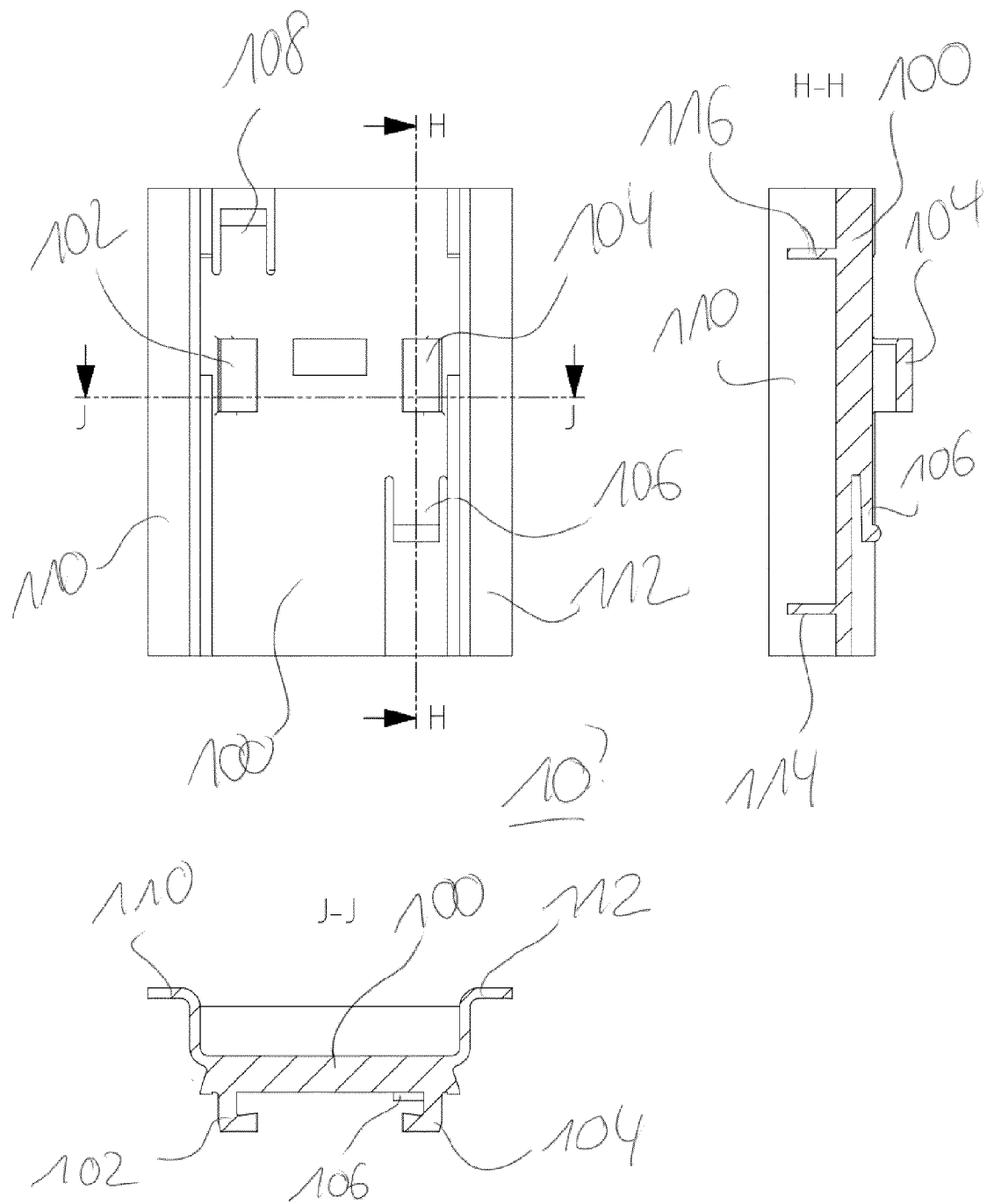
FIG. 3 is a further embodiment of the top-hat rail adapter in a view from below and two cross-section views.

FIG. 3 shows different views of a further embodiment of a top-hat rail adapter 10' in detail. The adapter 10' fulfills substantially the same function as the adapter 10 of FIGS. 1 and 2.

The top left view in FIG. 3 shows the bottom face of the adapter 10', which has a base plate 100 and two clamping legs 110, 112 arranged opposite to each other on the longitudinal faces of the base plate 100. Furthermore, two latch hooks 102, 104 are arranged on the bottom face of the adapter on the base plate 100 approximately symmetrically to the longitudinal axis of the base plate 100. In addition, two snap hooks 106, 108 are arranged asymmetrically to the longitudinal axis.

Figure 5:
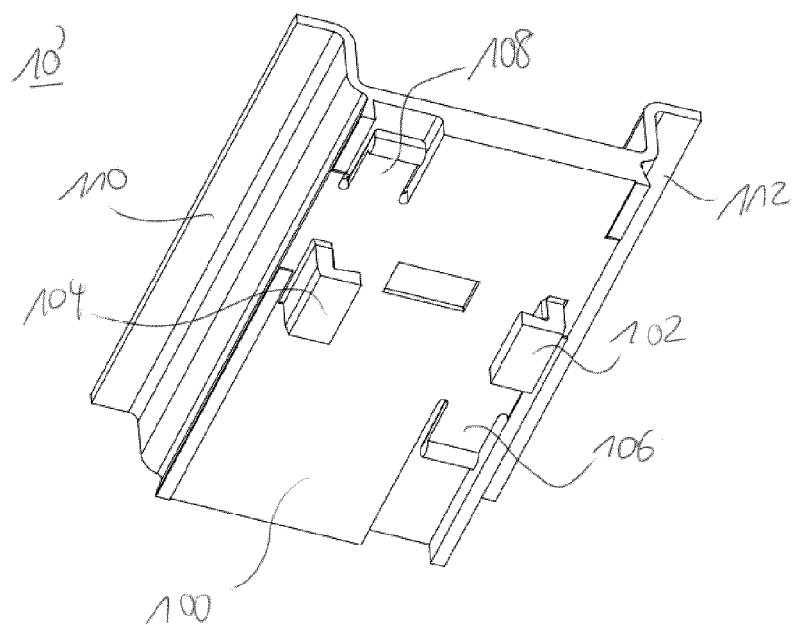

The form of the latch hooks 102, 104 is shown in the cross-section views along the lines H-H and J-J in the upper and lower right views and in FIG. 5, which shows the bottom face of the adapter 10' in a perspective view. The latch hooks 102, 104 are provided to engage in corresponding openings 102', 104' (FIG. 1) on the front plate 14' (FIG. 1) of a switching apparatus 14 (FIG. 1) and to latch into these openings by moving the adapter 10' in the installation plane in such a manner that the adapter 10' cannot fall off the switching apparatus without moving it.

The snap hooks 106, 108 are designed in the form of tongues having protrusions at their free ends. The protrusions are designed to engage or snap into the corresponding slot-shaped snap openings 106', 108' (FIG. 1) on the front plate 14' (FIG. 1) of a switching apparatus 14 (FIG. 1). Hereby, the snap hooks 106, 108 are arranged and designed in such a manner that, after the snapping in of the snap hooks 102, 104, when the adapter 10' has been moved, the protrusions are located approximately above the snap openings 106', 108' provided for this purpose and can snap into them. Due to the tongue-shaped design of the snap hooks 106, 108, if the corresponding material is selected, these can act like springs which press the protrusions into the snap openings 106', 108', whereby a slipping of the adapter 10' on the front panel can be efficiently prevented in the installed state, i.e. after everything is latched and snapped in. Releasing the connection between adapter 10' and front panel then requires overcoming the spring forces of the snap hooks 106, 108 and moving the adapter 10' correspondingly, in such a manner that the latch hooks 102, 104 can be released from their latching.

Figure 4:
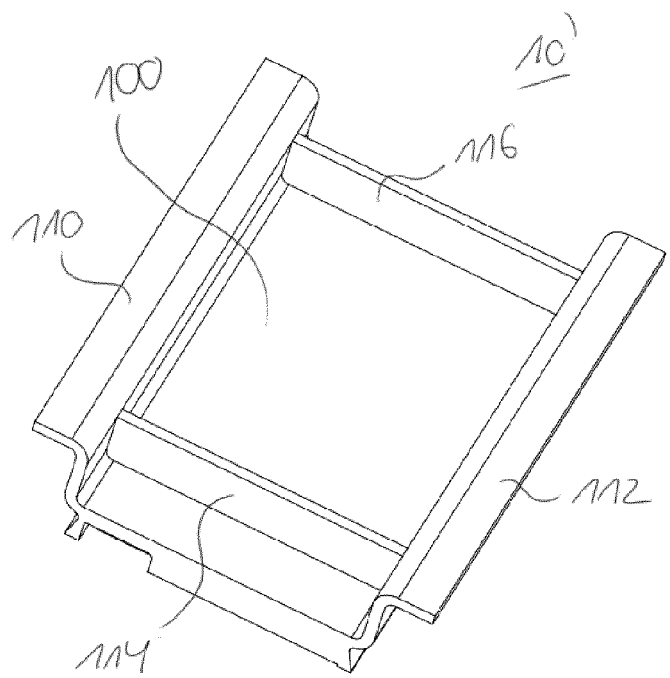
FIGS. 4 and 5 are the top-hat rail adapters of FIG. 3 in a diagonal top and bottom view.

In FIG. 4 the adapter 10' is shown in a perspective view diagonally from above. Between the terminal legs 110, 112 arranged on the two longitudinal faces of the base plate 100, two protrusions 114, 116 may extend in the form of partitions. These protrusions 114, 116 may, for example, form a protection against slipping of a component installed on the upper face of the adapter 10' and/or serve as an installation assistance for aligning a component to be installed. They can also improve the stability of the adapter 10' by forming crossbars, thereby preventing the twisting of the adapter 10'. Due to the stabilization, the material strength of the base plate 100 can be reduced under circumstances, which saves space in a stack arrangement.

The adapter 10, 10' may be manufactured as a single piece from a material which may in particular have sufficient rigidity and spring strength for the snap hooks. A particularly suitable material is plastic with sufficient spring stiffness. The adapter can also be designed as a punched part, for example from a spring steel.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. An adapter for installing electrotechnical components, comprising:
   a standardized support rail comprising a top-hat rail, and which has fastening means on an upper face thereof configured to install an electrotechnical component, and fastening means on a bottom face thereof configured to install on a front panel of an electrotechnical component,
   wherein the fastening means on the bottom face has at least one latch hook configured to latch into a corresponding latch opening on the front panel of the electrotechnical component, and/or the fastening means on the bottom face has at least one snap hook configured to snap into a corresponding snap opening on the front panel of the electrotechnical component.

2. The adapter according to claim 1, wherein at least one protrusion is provided on the upper face of the adapter.

3. The adapter according to claim 1, wherein the fastening means on the bottom face of the adapter has at least a screw, which is screwable into a corresponding threaded opening on the front plate of an electrotechnical component.

4. The adapter according to claim 1, wherein at least one of the fastening means on the bottom face of the adapter is configured to cooperate with a fastening means comprising a latch opening configured to install an additional component on the front panel of an electrotechnical component.

5. The adapter according to claim 1, wherein the adapter is comprised of plastic.

6. The adapter according to claim 1, wherein dimensions of the adapter in tan installation plane correspond to the front panel of at least one electrotechnical component such that no parts of the adapter project beyond the front panel(s).

7. An electrotechnical component for installation on a standardized support rail, comprising:
   a front panel having at least one latch opening and/or at least one threaded snap opening configured to latch or snap at least one latch hook or snap hook of the adapter according to claim 1.

8. A stacked arrangement, comprising:
   a first electrotechnical component;
   a second electrotechnical component; and
   the adapter according to claim 1, the adapter being installed on the front panel of the first component,
   wherein the second component, having fastening means on a bottom face thereof, is installed on fastening means on the upper face of the adapter.

9. An adapter for installing electrotechnical components, comprising:
   a standardized support rail comprising a top-hat rail, and which has fastening means on an upper face thereof configured to install an electrotechnical component, and fastening means on a bottom face thereof configured to install on a front panel of an electrotechnical component,
   wherein the fastening means on the bottom face has at least one latch hook configured to latch into a corresponding latch opening on the front panel of the electrotechnical component, and/or the fastening means on the bottom face has at least one snap hook configured to snap into a corresponding snap opening on the front panel of the electrotechnical component, and wherein the fastening means on the upper face of the adapter has at least one thread, into which a screw provided on the bottom face of an electrotechnical component is screwable.

\* \* \* \* \*